United States Patent [19]
Lane

[11] 3,976,868
[45] Aug. 24, 1976

[54] VOLTAGE SYNTHESIZATION
[75] Inventor: Lawrence J. Lane, Stuarts Draft, Va.
[73] Assignee: General Electric Company, Salem, Va.
[22] Filed: Aug. 26, 1975
[21] Appl. No.: 607,785

[52] U.S. Cl.............................. 235/184; 235/196; 324/158 R; 340/410
[51] Int. Cl.² ..................... G06G 7/48; G08B 29/00
[58] Field of Search ...... 235/184, 185, 196, 151.31, 235/197; 340/410; 324/57 R, 158 R, 158 MG, 73 R, 73 AT; 328/14; 322/25, 68; 323/66, 100

[56] References Cited
UNITED STATES PATENTS

| | | |
|---|---|---|
| 3,393,301 | 7/1968 | Valstar.......................... 235/151.31 |
| 3,652,930 | 3/1972 | Sugiyama et al................ 235/184 X |
| 3,808,516 | 4/1974 | Hentschel ................... 324/158 R X |
| 3,840,810 | 10/1974 | Fritts.............................. 324/158 R |

Primary Examiner—Joseph F. Ruggiero
Attorney, Agent, or Firm—Arnold E. Renner; Philip L. Schlamp

[57] ABSTRACT

A circuit for the simulation or synthesization of the equivalent voltage of a supply comprised of at least one voltage source and one impedance includes means to develop signals proportional to the instantaneous values of the voltage at the terminals of the supply and to the rate of change, with respect to time, of the current supplied to a load from the supply. The two signals thus developed are appropriately scaled and then combined to provide a simulation of the equivalent voltage of the supply.

15 Claims, 6 Drawing Figures

VOLTAGE SYNTHESIZATION

BACKGROUND OF THE INVENTION

The present invention relates generally to the production of a voltage signal and more particularly to the synthesization or simulation of the equivalent voltage of a supply, which supply need have only a pair of output terminals accessible.

There are many instances in which it is desirable to provide a signal; e.g., for feedback purposes, which is proportional to or which duplicates a supply voltage. Usually, the production of these signals presents no problem as any voltage sources within the supply are readily accessible and there are many ways by which suitable reproduction of this available voltage(s) can be achieved. There are, however, certain instances in which the reproduction of such a voltage does represent a problem. Examples include situations in which the voltages are very high or mechanical restrictions prevent access to the voltage source(s). Another example is that situation in which the effective voltage, desired to be reproduced, is derived from a plurality of individual sources which combine in a manner which make it impractical or impossible to directly access and combine the individual sources. In a sense, these situations are those in which there exists a "black box" without reasonable access to the interior and a need to provide, even during periods when the effective voltage of the circuitry within the box is changing, a simulation of the equivalent output voltage of that box. This equivalent voltage is known in the art as the Thevenin equivalent voltage.

A specific example of an application in which high voltages, mechanical restraints and plurality of voltage sources preclude a direct reproduction of the effective voltage may be found in certain generator excitation systems. One known type of generator excitation system, commonly referred to as "self-excited," employs voltage control of the field winding by permitting the short-circuiting of the field winding for a percentage of the time during each of the normal operating cycles of the generator to thereby control the degree of excitation. An example of such an excitation control system may be found in U.S. Pat. No. 3,369,171, "Control Circuits" by L. J. Lane, issued Feb. 13, 1968 and assigned to the assignee of the present invention. In this patent the generator field winding is excited through the use of the diode bridge circuit which receives power in the form of two voltage signals which are, respectively, proportional to the generator terminal voltage and to the current supplied to the generator load. In this patent, that controlled is the generator terminal voltage.

A known modification of the system of the U.S. Pat. No. 3,369,171 patent utilizes a feedback signal to control the field voltage. This system is outlined in greater detail in co-pending patent application, Ser. No. 607,784, "Generator Control System" by G. S. Chambers and L. J. Lane, filed on even date herewith and assigned to the assignee of the present invention. As explained in that co-pending application, the prior art control of the U.S. Pat. No. 3,369,171 exhibits a non-linearity in the feedback path due to a multiplication which is inherent in the circuitry so that the control is not as accurate as desired in all instances. Accordingly, in the co-pending application there is provided an improved system wherein the Thevenin equivalent voltage of the exciter bridge circuit is utilized as a modifying factor to linearize the feedback control. As explained in that co-pending application, the improved generator excitation system requires, for an enhanced feedback control, an accurate representation of the equivalent voltage, i.e., the Thevenin equivalent voltage, of the exciter circuit and, as stated therein, preferably employs the present invention to achieve that equivalent voltage.

SUMMARY OF THE INVENTION

It is, therefore, an object of the present invention to provide for the synthesis of the equivalent voltage of a voltage supply.

It is a further object to provide a circuit for simulating the equivalent voltage of a supply furnishing current to the load without requiring access to other than the supply terminals and the load current carrying conductors.

It is a still further object to synthesize the Thevenin equivalent voltage of a supply without knowledge of the exact nature of the supply.

It is another object to simulate the Thevenin equivalent voltage of a voltage supply which furnishes current to a load by way of conductors connected to a pair of terminals of the supply.

The foregoing and other objects are achieved, in accordance with the present invention, by providing circuitry which simulates the equivalent voltage supplying current to a load from a pair of accessible terminals by producing a first signal proportional to the voltage at the terminals. Further included are means to produce a second signal proportional to the rate of change, with respect to time, of the load current. By appropriate circuit means the two voltage signals thus produced are properly ratioed and combined to develop the simulation of the voltage of the supply.

BRIEF DESCRIPTION OF THE DRAWING

While the present embodiment is described in particularity in the claims annexed to and forming a part of this specification, a better understanding of the invention may be had by reference to the following description taken in conjunction with the accompanying drawing in which:

DETAILED DESCRIPTION

Figure 1:
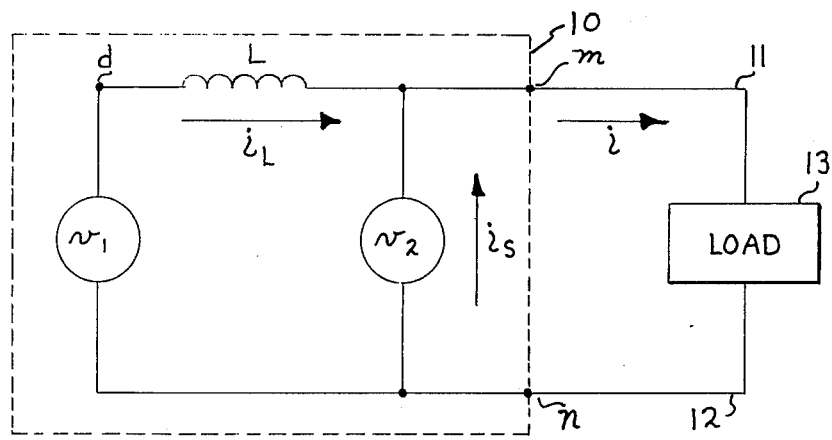
FIG. 1 is a schematic drawing of a typical circuit illustrating a voltage supply with an associated load which is helpful in developing a foundation for the understanding of the present invention.

FIG. 1 shows the equivalent of a typical voltage supply circuit such as is found in the aforementioned copending application Ser. No. 607,784. It is to be expressly understood, as will become apparent as this description proceeds, that the depiction of FIG. 1 is strictly exemplary and, as will be understood by those skilled in the art, different circuits would follow a similar analysis to that which follows. Before proceeding with a description of FIG. 1, however, it should be explained that throughout this specification voltages will be indicated by a "$v$" with a subscript indicating the point of reference. A single subscript indicates that the voltage is taken with respect to ground while a double subscript indicates the voltage between the two points in the circuit designated by the subscripts. In a like manner, currents will be designated by an "$i$" with a subscript, where desired, to distinguish between various currents. Also, throughout the specification, like components will be designated by similar reference characters with the value of resistors, inductors, capacitors, etc. being indicated by their corresponding reference character within the formulas.

It should also be expressed that throughout this specification, including the claims, that the terms "voltage supply", "load" and their equivalents are to be considered in their broadest sense. That is, the terms are intended to be relative with respect to one another and are not intended to be limited to any strict interpretation thereof.

Referring now to FIG. 1, shown within a dashed line box 10 is a voltage supply which may be inaccessible, except as to a pair of terminals $m$ and $n$ to which are connected a pair of conductors 11 and 12 which supply a current $i$ to a load 13. Included within box 10 is a pair of voltage sources $v_1$ and $v_2$ and an impedance element, inductor L. Impedance element L represents the impedance of the circuit within box 10 and is shown located between a top terminal $d$ of the voltage source $v_1$ and the upper terminal of the voltage source $v_2$ which is directly connected to terminal $m$. A current, $i_L$ flows within the inductor L and a second current, $i_s$, flows through the second voltage source $v_2$. These two currents combine to make the load current $i$. A mathematical analysis of the FIG. 1 circuit is as follows:

$$v_1 = v_{mn} + v_{dm} \tag{1}$$

$$v_1 = v_{mn} + L \frac{di_L}{dt} \tag{2}$$

$$i_L + i_s = i \tag{3}$$

$$\frac{di_L}{dt} + \frac{di_s}{dt} = \frac{di}{dt} \tag{4}$$

$$\frac{di_L}{dt} = \frac{di}{dt} - \frac{di_s}{dt} \tag{5}$$

Substituting for $di_L/dt$ in equation (2) gives:

$$v_{mn} + L\left(\frac{di}{dt} - \frac{di_s}{dt}\right) = v_1 \tag{6}$$

$$v_{mn} + L \frac{di}{dt} - L \frac{di_s}{dt} = v_1 \tag{7}$$

or, $$v_{mn} = v_1 + L \frac{di_s}{dt} - L \frac{di}{dt} \tag{8}$$

Assuming $v_1$ and $i_s$ are sinusoidal, equation (8) expressed in RMS terms becomes:

$$V_{mn} = V_1 + jX_L I_s - L \frac{di}{dt} \tag{9}$$

wherein $X_L$ is the reactive impedance of inductor L.

The *Radio Engineer's Handbook* by F. E. Terman (McGraw-Hill Book Company, Inc., Copyright 1943) states Thevenin's theorum as:

Any linear network containing one or more sources of voltage and having two terminals behaves, insofar as a load impedance connected across the terminals is concerned, as though the network and its generators were equivalent to a simple generator having an internal impedance Z and a generator voltage E, where E is the voltage that appears across the terminals when no load impedance is connected and Z is the impedance that is measured between the terminals when all sources of voltage in the network are short-circuited.

Applying 4 this to the FIG. 1 circuit, it is seen from equation (8) above that the term $[v_1 + L(di_s/dt)]$ represents the Thevenin equivalent voltage while the term $[L(di/dt)]$ represents the voltage drop across the Thevenin equivalent impedance of the circuit within box 10. Thus, the circuit of FIG. 1 may be represented as illustrated in FIG. 2 and by the equation:

$$v_{mn} = v_{Thev} - L \frac{di}{dt} \tag{10}$$

or $$v_{Thev} = v_{mn} + L \frac{di}{dt} \tag{11}$$

Figure 2:
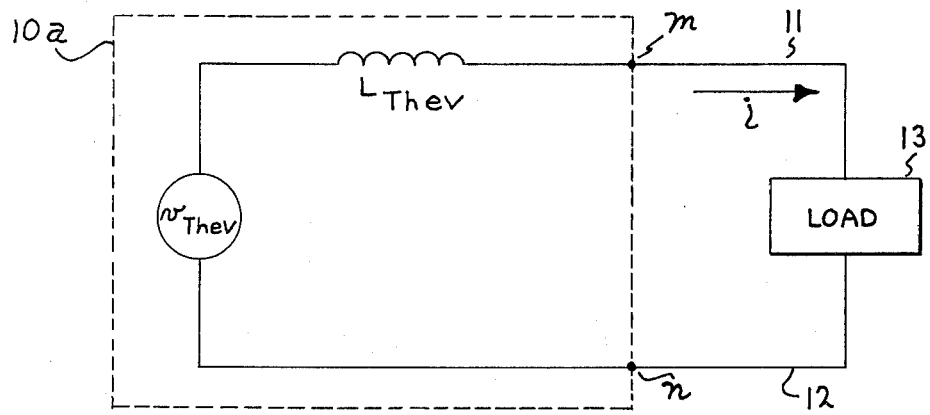
FIG. 2 is a schematic drawing showing the Thevenin equivalent circuit of the circuit of FIG. 1.

Thus, as shown in FIG. 2, the circuit of FIG. 1 may be represented as, within dashed line box 10a, a voltage source $v_{Thev}$ connected in series with an impedance $L_{Thev}$. The supply within block 10a, from its terminals $m$ and $n$, supplies a current $i$ to the load 13.

Figure 3:
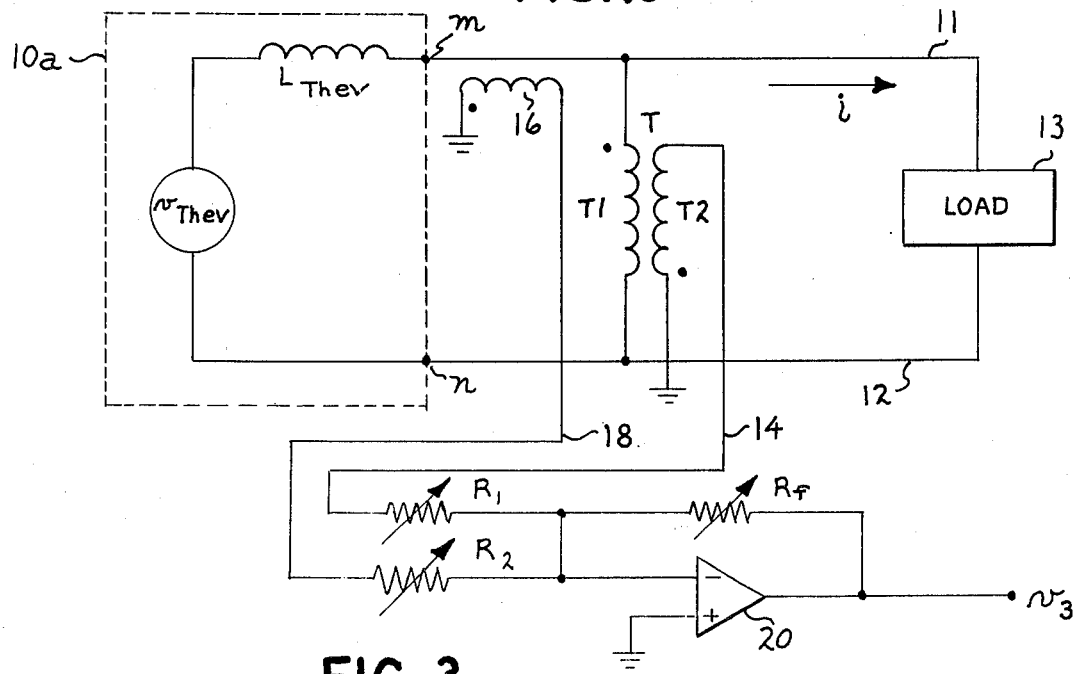
FIG. 3 is a schematic drawing illustrating the present invention in its preferred embodiment as applied to a voltage supply which is primarily inductive in nature.

FIG. 3 illustrates the present invention in its preferred embodiment as applied to a supply which is primarily inductive in nature. In FIG. 3 there is again included within the dashed line of block 10a a voltage supply including a source $v_{Thev}$ and a series impedance $L_{Thev}$. The output terminals $m$ and $n$ of the block are accessible and are connected by conductors 11 and 12 to a load 13 through which a load current $i$ flows.

It will be remembered from equation (11) above that the Thevenin equivalent voltage ($v_{Thev}$) is comprised of two terms, $v_{mn}$ and $L (di/dt)$. The first term, $v_{mn}$, a voltage signal proportional to the supply terminal voltage is provided through the use of a transformer T having its primary winding T1 connected across terminals $m$ and $n$. The transformer secondary winding T2 has one end connected to ground and the other end connected via a lead 14 to a resistor $R_1$. Thus, the voltage with respect to ground, appearing on line 14 ($v_{14}$) will be proportional to the voltage $v_{mn}$. It should be noted that the use of a transformer is not necessary and that the voltage of, for example, terminal $m$ could be taken with respect to ground. The use of a transformer is desirable, however, because of the isolation provided thereby and because such use provides for an easy scaling of this signal. The second voltage term, $L(di/dt)$, is provided through the utilization of an induction coil 16 which is inductively coupled to one of the load current carrying conductors; e.g., conductor 11. Coil 16 is preferably a toroid wound upon a nonmagnetic, nonconducting core, for example an air core or a ceramic core, so that the voltage induced into that coil is an accurate portrayal or representation of the change in the load current, $i$, with respect to time; i.e., $di/dt$. Coil 16 has one end thereof connected to ground and the free end connected by way of a conductor 18 to a second resistor $R_2$. As such, the voltage with respect to ground appearing on line 18 ($v_{18}$) will be proportional to the rate of change in the load current with respect to time.

The free ends of resistors $R_1$ and $R_2$ are joined together and form the common input to the inverting input of an operational amplifier 20, of standard design, which has its noninverting input connected to ground. A feedback resistor $R_f$ is connected between the output and the inverting input of the operational amplifier 20 in a manner well known in the art. Amplifier 20 provides an output $v_3$ which is proportional to the sum of its inputs and which is a voltage signal proportional to the Thevenin equivalent voltage of the supply 10a. Resistors $R_1$ and $R_2$ and $R_f$ are preferably variable resistors for adjustment of the circuit as will be more fully understood from the following description.

The operation of the circuitry of FIG. 3 may be best understood from the following mathematical analysis. Looking first at the voltage signal derived from coil 16, the instantaneous voltage on line 18 ($v_{18}$) is defined by the equation:

$$v_{18} = -M \frac{di}{dt} \qquad (12)$$

wherein M equals the mutual inductance of coil 16 and the load conductor 11.

The second voltage signal, that proportional to the terminal voltage ($v_{mn}$), is derived from the transformer secondary T2 and the voltage on line 14 ($v_{14}$) may be expressed by the formula:

$$v_{14} = -v_{mn} \cdot \frac{N_{T2}}{N_{T1}} \qquad (13)$$

wherein $N_{T2}/N_{T1}$ is the ratio of turns of the windings of transformer T.

Because the inductor L (FIG. 1) and the coil 16 are defined for any given circuit, M is proportional to L by a constant factor $a_m$, or:

$$M = a_m L. \qquad (14)$$

Conventional operational amplifier application teaches that the gain of such an amplifier stage is proportional to the ratio of its feedback resistor to its input resistor. Further, an operational amplifier stage introduces a signal inversion, so that;

$$v_3 = -\left(\frac{R_f}{R_1} \cdot v_{14} + \frac{R_f}{R_2} \cdot v_{18}\right) \qquad (15)$$

wherein $v_3$ is the output of amplifier 20. Substituting from equations (12) and (13) into equation (15) gives:

$$v_3 = \frac{R_f}{R_1} \cdot \frac{N_{T2}}{N_{T1}} \cdot v_{mn} + \frac{R_f}{R_2} \cdot M \cdot \frac{di}{dt}. \qquad (16)$$

Realizing that in equation (16) the terms $N_{T2}/N_{T1}$ and M are constants, and that M is proportional to L (equation 14), the similarities between equations (11) and (16) become immediately obvious and it can be accurately stated that the term $v_3$ is proportional to the Thevenin equivalent voltage, $v_{Thev}$, by some factor, as yet undetermined. Stated mathematically, $$v_3 = \frac{v_{Thev}}{a_T} \qquad (17)$$

wherein $a_T$ is a constant. Combining equations (16) and (17) gives:

$$v_3 = \frac{v_{Thev}}{a_T} = \frac{R_f}{R_1} \cdot \frac{N_{T2}}{N_{T1}} \cdot v_{mn} + \frac{R_f}{R_2} \cdot M \cdot \frac{di}{dt} \qquad (18)$$

or $$v_{Thev} = a_T v_3 = a_T \cdot \frac{R_f}{R_1} \cdot \frac{N_{T2}}{N_{T1}} \cdot v_{mn} + a_T \cdot \frac{R_f}{R_2} \cdot M \cdot \frac{di}{dt}. \qquad (19)$$

If now $a_T(R_f/R_1) \cdot (N_{T2}/N_{T1})$ were set equal to 1 and $a_T(R_f/R_2) \cdot M$ were set equal to $L$, then equation (19) would be reduced to:

$$v_{Thev} = v_{mn} + L \frac{di}{dt} = v_3 a_T \qquad (20)$$

and the output voltage of amplifier 20 ($v_3$) would be proportional to the Thevenin equivalent voltage shown in box 10a of FIG. 3 and would remain in the same proportion thereto even though the Thevenin equivalent voltage of box 10a were to change. This setting of $a_T(R_f/R_1) \cdot (N_{T2}/N_{T1}) = 1$ and $a_T(R_f/R_2) \cdot M = L$ is achieved by varying the values of the resistors $R_1$, $R_2$ and $R_f$.

At least two methods of determining the values of $R_1$, $R_2$ and $R_f$ are available. In the first of these methods the resistors $R_1$, $R_2$ and $R_f$ are preferably first set to their approximate correct value which will be known because, in most cases, the approximate Thevenin equivalent voltage is known or can be determined in the manner described below. With the circuit in a steady state, the load is disconnected and the open circuit voltage ($v_{mn}$) measured. This measured voltage will be equal to the Thevenin equivalent voltage because no current is now present. The output of amplifier 20 is also measured. Because the load is disconnected and there is no current, equation (19) becomes:

$$v_{Thev} = a_T v_3 = a_T \cdot \frac{R_f}{R_1} \cdot \frac{N_{T2}}{N_{T1}} \cdot v_{mn}. \quad (21)$$

The value of $a_T$ can now be determined employing the voltage value just measured from the expression:

$$a_T = \frac{v_{Thev}}{v_3}. \quad (22)$$

Once having determined the value of $a_T$, the ratio of $R_f/R_1$ is readily found from the previously given expression of $1 = a_T(R_f/R_1)\cdot(N_{T2}/N_{T1})$, recognizing that $N_{T2}/N_{T1}$ is a known design constant of the transformer T.

While the value of the inductance L may not be known with any degree of accuracy the value of M (the mutual inductance of coil 16 and the conductor) is known or can be accurately measured. Therefore, to obtain the ratio of $R_f/R_2$, one need to merely reconnect the load, measure the $di/dt$ of the load current and the voltage between terminals m and n ($v_{mn}$). All factors except $R_f/R_2$ in equation (19) are now known and that equation may be solved to obtain this ratio. With all factors known, resistors $R_1$, $R_2$ and $R_f$ may be properly set and the voltage signal $v_3$ will be equal to the Thevenin equivalent voltage of the supply 10a; i.e., $v_{Thev}$.

It was stated that at least two ways of adjusting the resistors $R_1$, $R_2$ and $R_f$ are readily available. The first, an analytical approach, has just been described. The second method which is commonly used in many actual situations is more empirical but is normally much faster and provides very accurate results. In this method, the load is disconnected and by use of suitable instrumentation such as an oscilloscope, the voltage which appears at the output of operational amplifier 20 ($v_3$) is recorded both as to wave shape and magnitude. Holding the circuit within block 10a in a steady state, the load is reconnected and with the oscilloscope retaining the previously recorded shape and value of $v_3$ the resistors $R_1$, $R_2$ and $R_f$ are adjusted to duplicate that wave shape. While this second method is less analytical than the first, it has the distinct advantage of being an extremely rapid way of adjusting the resistors and assuming the use of good instrumentation, provides results of a high degree of accuracy. Regardless of the method employed, once resistors $R_1$, $R_2$ and $R_f$ are adjusted to their proper values, no further adjustment is necessary and the voltage output from the amplifier 20 ($v_3$) will be a simulation or synthesization of the Thevenin equivalent voltage of the circuit 10a.

Figure 4:
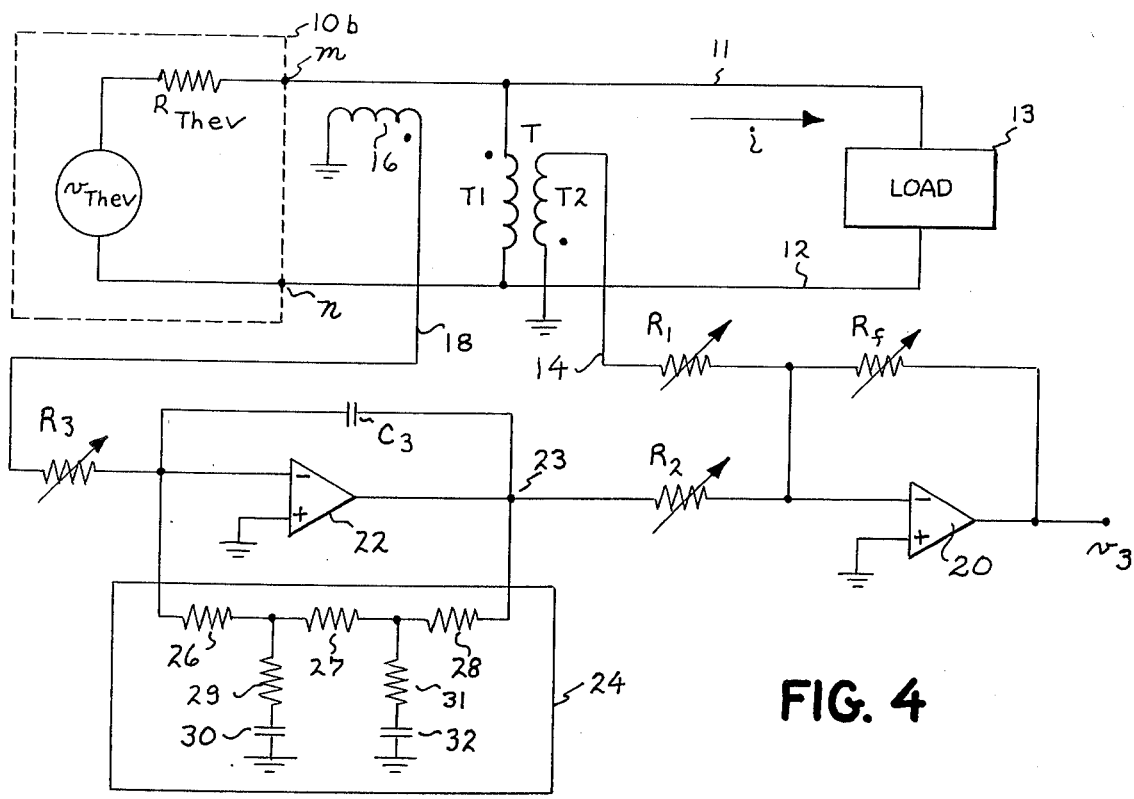
FIG. 4 is a schematic drawing illustrating the present invention in its preferred embodiment as applied to a voltage supply which is primarily resistive in nature.

FIG. 4 illustrates the present invention as applied to a circuit in which the voltage supply is predominently resistive in nature. The load circuit portion of FIG. 4 is substantially identical to that shown with respect to FIG. 3 with the exception that the voltage supply shown here in the dashed line block 10b includes a resistive element $R_{Thev}$ in place of the inductive element $L_{Thev}$ shown in block 10a of FIG. 3. In FIG. 4, a Thevenin equivalent voltage $v_{Thev}$ supplies a current $i$ to the load 13 with access to the circuitry within dashed line block 10b being available by way of terminals m and n. As before, a transformer T has its primary winding T1 connected across the terminals m and n and its secondary winding T2 has one end connected to ground. The free end of the transformer secondary T2 is applied via lead 14 to a resistor $R_1$ forming one input to an amplifier 20 having a second input resistor $R_2$ and a feedback resistor $R_f$ connected between its input and its output all as previously described with respect to FIG. 3. The output of amplifier 20 is the representation or simulation of the Thevenin equivalent voltage of the supply 10b and is designated $v_3$. A coil 16 is also again provided having one end connected to ground and its other end providing a voltage signal ($v_{18}$) on lead 18. In this instance, however, instead of the lead 18 being connected directly to resistor $R_2$, lead 18 forms an input to an integrating circuit comprised of an operational amplifier 22, an input resistor $R_3$ to which lead 18 is connected and a capacitor $C_3$ connected between the inverting input and the output of amplifier 22. This integrating circuit is of the standard type well known in the art. The output of amplifier 22 (point 23) forms the input to the resistor $R_2$. The values of the components $R_3$ and $C_3$ are selected to give a convenient level of output voltage from the amplifier 22 and are further selected to provide sufficiently long time constant to prevent that amplifier from saturating.

In order to give a steady state output from the amplifier and further guard against saturation, a filter circuit shown generally within a block 24 is connected between the input and output of the amplifier 22. Filter 24 may be of any suitable type and is illustrated as including three resistors 26, 27 and 28 connected in series between the amplifier input and output. Extending between the junction of each two resistors and ground is a series combination of a resistor and a capacitor. That is, connected between ground and the junction between resistors 26 and 27 is the series combination of a resistor 29 and a capacitor 30. In a like manner, connected between the junction of resistors 27 and 28 and ground is the series combination of a resistor 31 and a capacitor 32.

The voltage appearing on line 18 will be equal to $M\cdot di/dt$ (similar to that of FIG. 3 but with reversed polarity) and the integrated output of the amplifier 22 (point 23) will be equal to the integral of its input. That is, $$v_{18} = M \frac{di}{dt} \quad (23)$$

and $$v_{23} = -\frac{1}{R_3 C_3} \int v_{18} \, dt; \quad (24)$$

substituting for $v_{18}$, $$v_{23} = -\frac{1}{R_3 C_3} \int M \, di = -\frac{M}{R_3 C_3} i. \quad (25)$$

(It is noted that, in equations such as 25 above or those which follow and involve an integration, there will be a constant of integration. By proper circuit design, for example, by the design of the filter 24 in FIG. 4, this constant can be made equal to zero and the constant has, therefore, been omitted from the equations for sake of simplicity.)

In a manner similar to that described with respect to FIG. 3, with the load connected and assuming a perfect transformer, the voltage equation for the load circuit loop of FIG. 4 can be written as:

$$v_{Thev} = v_{mn} + (R_{Thev} \cdot i). \quad (26)$$

Thus, for the signal ($v_3$) at the output of amplifier 20 to be an accurate reproduction of the Thevenin equivalent voltage of the supply 10b, its inputs must have the same wave shape as and be proportional to the voltage $v_{mn}$ and the current $i$. The proper scaling or ratioing is provided primarily by resistors $R_1$ and $R_2$. The signal applied to resistor $R_1$ has the same origin as was described with respect to FIG. 3. Hence, the equation for the signal $v_3$ and $v_{Thev}$ may be written as:

$$v_3 = \frac{R_f}{R_1} \cdot \frac{N_{T2}}{N_{T1}} \cdot v_{mn} + \frac{R_f}{R_2} \cdot \frac{M}{R_3 C_3} \cdot i = \frac{v_{Thev}}{a_T} \quad (27)$$

and thus, $$v_{Thev} = a_T v_3 = a_T \cdot \frac{R_f}{R_1} \cdot \frac{N_{T2}}{N_{T1}} \cdot v_{mn} + a_T \cdot \frac{R_f}{R_2} \cdot \frac{M}{R_3 C_3} \cdot i. \quad (28)$$

If, then, the relationships of $$a_T \cdot \frac{R_f}{R_1} \cdot \frac{N_{T2}}{N_{T1}} = 1 \quad (29)$$

and $$a_T \cdot \frac{R_f}{R_2} \cdot \frac{M}{R_3 C_3} = R_{Thev} \quad (30)$$

are established, and $a_T$ is established at its proper value in the same manner as was described with respect to FIG. 3, then equation (28) may be rewritten as:

$$v_{Thev} = V_{mn} + R_{Thev} \cdot i = v_3 a_T \quad (31)$$

The actual adjustment of te variable components; i.e., the four variable resistors $R_1$, $R_2$, $R_3$ and $R_f$, is accomplished in a manner similar to that earlier explained. As before, the factor $a_T$ may be determined by measuring, with the load disconnected, the voltage across terminals $m$ and $n$ and the output $v_3$ of the amplifier 20 and the simple ratio taken. The values of $R_f$ and $R_1$ then may be calculated as before and as set forth in equation (29) above. If it is possible or practical to short-circuit all voltage sources within the supply 10b then the Thevenin equivalent impedance $R_{Thev}$ may be measured and the calculation of the ratio $R_f/R_2$ made. If it is not possible or is impractical to accurately determine $R_{Thev}$, the most practical way of adjusting the several resistors, primarily $R_1$, $R_2$ and $R_f$, to achieve the proper output $v_3$ is the empirical method described; i.e., record the output $v_3$ with no load current and then connect the load and adjust the variable components to duplicate that previously recorded.

Figure 5:
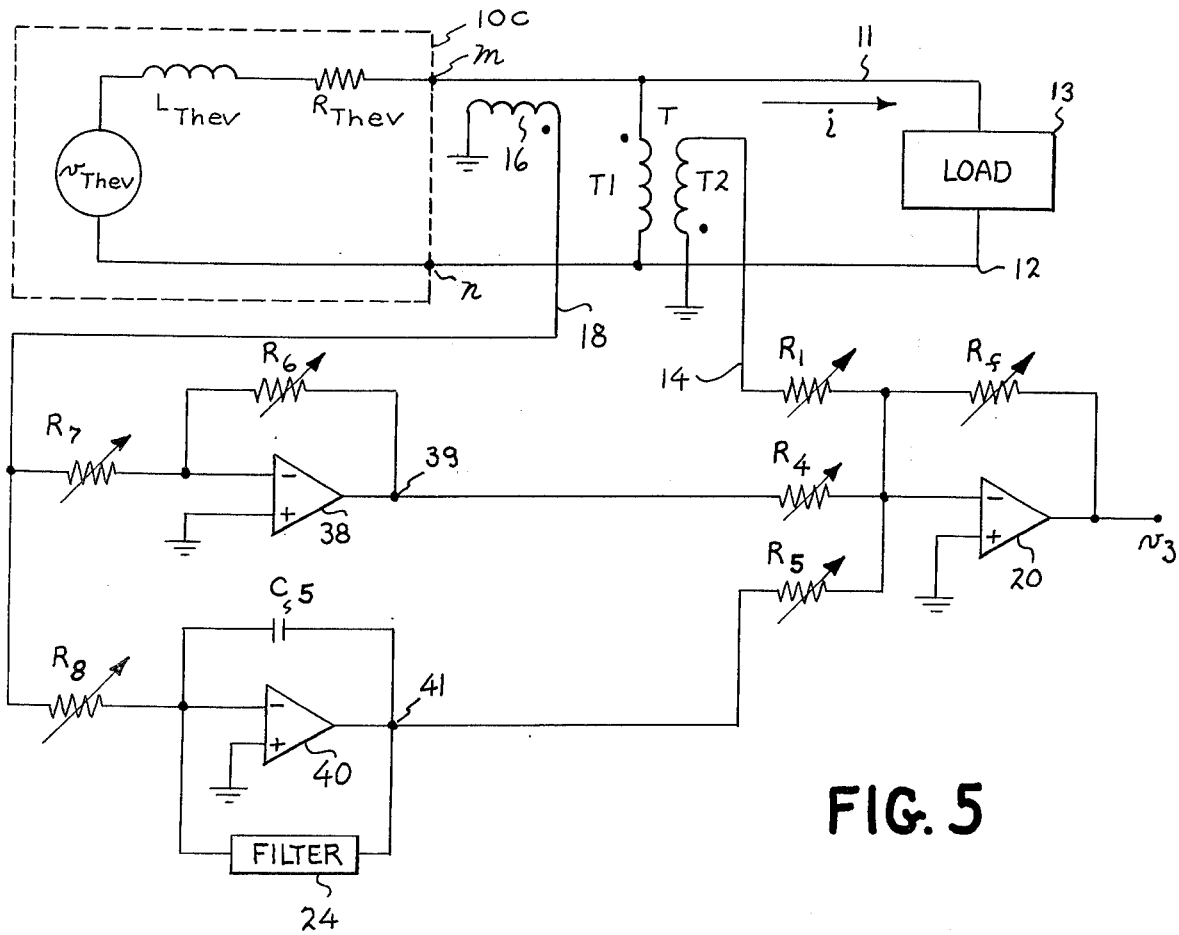
FIG. 5 is a schematic drawing illustrating the present invention in a first embodiment as applied to a voltage supply which is essentially resistive and inductive in nature; and, FIG. 6 is a schematic drawing illustrating the present invention in a second embodiment as applied to a voltage supply which is essentially resistive and inductive in nature.

FIG. 5 illustrates the application of the present invention to the situation in which the voltage supply has both inductive and resistive components as is illustrated by the elements $L_{Thev}$ and $R_{Thev}$ in the dashed line box 10c. As before, a current $i$ is supplied to the load 13 from the terminals $m$ and $n$ of the supply 10c by conductors 11 and 12. A transformer T having a primary T1 and a secondary T2 has its primary connected across the terminals $m$ and $n$ to output a voltage signal proportional to the terminal voltage and an induction coil 16 provides an output voltage signal proportional to the rate of change of the current. The outputs of the coil 16 and the transformer secondary T2 are provided, respectively, on lines 18 and 14. A summing amplifier 20 is again provided having a feedback resistor $R_f$ and the output of the summing amplifier 20 is the desired output signal ($v_3$). In this instance, however, three inputs are provided to the summing amplifier 20, respectively, through three resistors $R_1$, $R_4$ and $R_5$. Resistor $R_1$ is, as before, connected to the line 14 to receive the voltage signal from the transformer secondary T2.

The signal on line 18 ($v_{18}$) serves as an input to two additional operational amplifiers. A first amplifier 38, having a feedback resistor $R_6$ and an input resistor $R_7$, serves essentially an inversion function so that its output at point 39 is of proper polarity. Amplifier 38 can also provide a scaling function is that its gain is a function of the ratio of the resistors $R_6$ and $R_7$. Thus, if the magnitude of the signal appearing on line 18 were close to the desired value for inputting to amplifier 20 via resistor $R_4$, resistors $R_6$ and $R_7$ would be made equal, giving amplifier 38 a gain of minus unity; i.e., inversion would be its only function. Similarly, if the magnitude of the signal on line 18 were smaller than desired as an input to resistor $R_4$, then the resistors $R_6$ and $R_7$ would be adjusted to provide amplification gain while if that signal were higher than desired these two resistors would be adjusted to attenuate the signal. For this reason, resistors $R_6$ and $R_7$ may also be of the variable type.

The voltage signal $v_{18}$ on line 18 is also applied to a second operational amplifier 40 by way of an input resistor $R_8$ (also preferably variable). A capacitor $C_5$ is provided between the input and output of the amplifier 40 and a filter circuit 24 similar to that described with respect to FIG. 4 also may be provided between the input and the output. Amplifier 40 and its related circuits provides an integration function of the typed described with respect to amplifier 22 in FIG. 4 and the output of this amplifier, appearing at point 41, is applied as the input signal via resistor $R_5$ to the summing amplifier 20. As such, amplifier 20 will output a signal, $v_3$, which is proportional to the weighted sum of the three input signals via resistors $R_1$, $R_4$ and $R_5$.

In view of the previous descriptions, a detailed analysis of the FIG. 5 depiction is considered unnecessary and it is believed that the following mathematical analysis utilizing the same notation system as before will adequately describe this circuit. Mathematically, the circuit of FIG. 5 may be described as:

$$v_{Thev} = v_{mn} + R_{Thev} \cdot i + L_{Thev} \cdot \frac{di}{dt} = \frac{v_3}{a_T} \quad (32)$$

$$v_{18} = M \frac{di}{dt}, \quad (33)$$

and $$v_{41} = -\frac{1}{R_8 C_5} \int M di = -\frac{M}{R_8 C_5} i. \quad (34)$$

Therefore, $$v_{Thev} = a_T v_3 = a_T \cdot \frac{R_f}{R_1} \cdot \frac{N_{T2}}{N_{T1}} \cdot v_{mn} + a_T \cdot \frac{R_f}{R_4} \cdot \frac{R_6}{R_7} \cdot M \frac{di}{dt} + a_T \cdot \frac{R_f}{R_5} \cdot \frac{M}{R_8 C_5} \cdot i. \quad (35)$$

If the following relationships are established, $$a_T \cdot \frac{R_f}{R_1} \cdot \frac{N_{T2}}{N_{T1}} = 1 \quad (36)$$

and $$a_T \cdot \frac{R_f}{R_4} \cdot \frac{R_6}{R_7} M = L_{Thev} \quad (37)$$

and $$a_T \cdot \frac{R_f}{R_5} \cdot \frac{M}{R_8 C_5} = R_{Thev} \quad (38)$$

then $$a_T v_3 = v_{mn} + R_{Thev} \cdot i + L_{Thev} \cdot \frac{di}{dt} + v_{Thev}. \quad (39)$$

Equation (39) expresses the results desired from the circuitry shown in FIG. 5. That is, that the output voltage signal of the amplifier 20 ($v_3$) is proportional to the Thevenin equivalent voltage of the supply 10c. To achieve proper adjustment of the several components, procedures substantially identical to those described above with respect to FIGS. 3 and 4 may be employed. The factor $a_T$ is determined in the same manner as before. Resistors $R_f$ and $R_1$ can then be determined. Resistors $R_6$, $R_7$ and $R_8$ were reasonably determined as described. Resistors $R_6$ and $R_7$ were adjusted to output a signal from amplifier 38 which is of proper magnitude and resistor $R_8$ was adjusted in the same manner as described with respect to resistor $R_3$ of FIG. 4; i.e., to provide the proper time constant for the integrating circuit associated with amplifier 40. As was previously the case, if it is practical to determine the Thevenin equivalent impedance of the dashed line box 10c such as by measuring the short-circuit current and calculating these values, then the equations of (36), (37) and (38) may be utilized to determine the proper values of the resistors $R_4$ and $R_5$. If this method is not practical or does not give sufficiently accurate results because of inaccuracies in determining the Thevenin equivalent impedance, then the empirical method of recording the wave form at $v_3$ in the absence of a load current and reproducing that wave form with the load reconnected by adjustment of the several resistors is a practical and accurate means of achieving the desired results.

Figure 6:
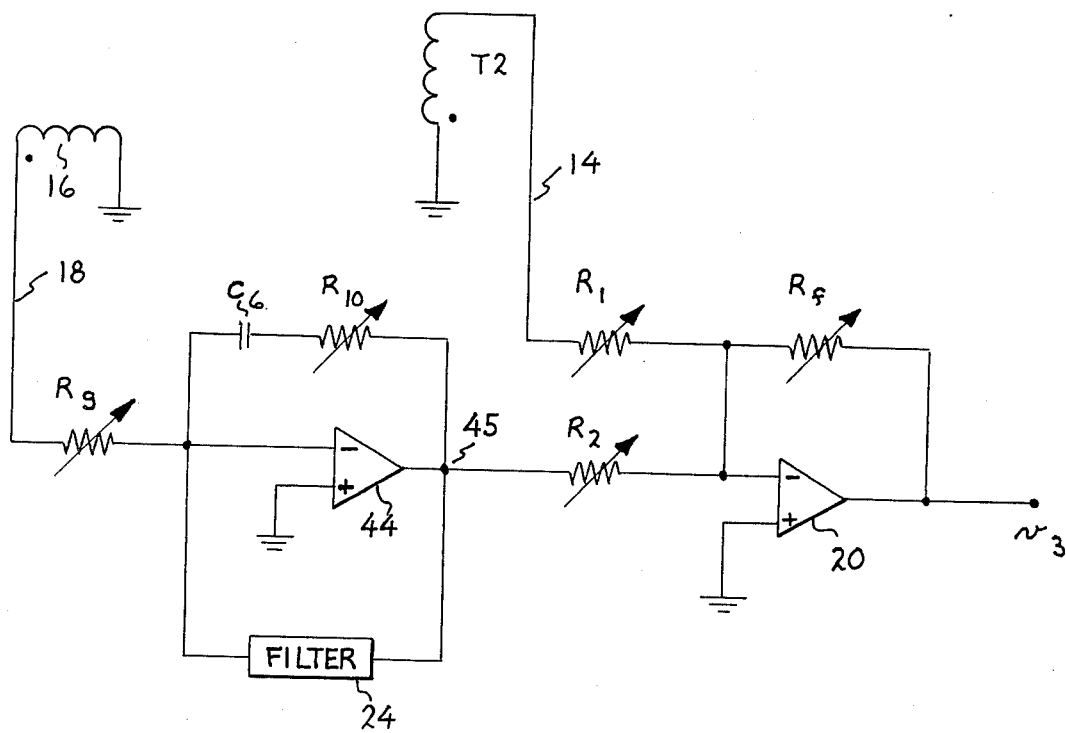

FIG. 6 shows a second embodiment of the present invention as applied to a source which contains both inductive and resistive components such as is illustrated in FIG. 5. The load portion of the circuitry has been omitted in FIG. 6 for purposes of simplicity. FIG. 6 is very similar to FIG. 5 although somewhat simpler in implementation in that the inversion and integrating functions performed by the amplifiers 38 and 40 of FIG. 5 (including their associated circuitry) here are combined into a single unit. Referencing now FIG. 6, shown is the coil 16 and the secondary T2 of the transformer T which respectively output on lines 18 and 14 their signals proportional to the rate of change, with respect to time, of the load current and the supply terminal voltage $v_{mn}$. An operational amplifier 20, similar to that shown in FIGS. 3 and 4, is provided with two input resistors $R_1$ and $R_2$ and a feedback resistor $R_f$. As before, the output of the amplifier 20 is a signal $v_3$ which is the desired signal. As was also the case with respect to FIGS. 3 and 4 the voltage feedback signal on line 14 serves via resistor $R_1$ as one input to the inverting input of amplifier 20 with the second input being via resistor $R_2$. Resistor $R_2$ receives its input signal from an additional amplifier 44 having an input resistor $R_9$. A feedback path comprising the series combination of a resistor $R_{10}$ and a capacitor $C_6$ is provided between the output (point 45) and the input of the amplifier 44. A filter 24 which may be identical to that illustrated in detail in FIG. 4 is provided between the input and output of the amplifier 44. As was the case with FIG. 5 with the preceding discussion in mind, the operation of the circuit of FIG. 6 is believed to be sufficiently described by the mathematical analysis of that circuit which follows.

In the following equations an operator "$p$" will be utilized. The operator "$p$" is equal to $d/dt$. The equations relevant to FIG. 6 are:

$$v_{Thev} = v_{mn} + R_{Thev} \cdot i + L_{Thev} \cdot \frac{di}{dt} \quad (40)$$

$$= v_{mn} + R_{Thev} \left( 1 + p \frac{L_{Thev}}{R_{Thev}} \right) i$$

$$v_{18} = M \frac{di}{dt} = Mpi \quad (41)$$

$$v_{14} = v_{mn} \cdot \frac{N_{T2}}{N_{T1}} \quad (42)$$

$$v_{45} = - \frac{R_{10} + 1/pC_6}{R_9} \cdot v_{18} \quad (43)$$

(wherein $v_{45}$ = voltage at point 45, the output of amplifier 44) or, $$v_{45} = - \frac{1 + pR_{10}C_6}{pR_9 C_6} \cdot v_{18} \quad (44)$$

$$v_3 = - \left( \frac{R_f}{R_1} \cdot v_{14} + \frac{R_f}{R_2} \cdot v_{45} \right) \quad (45)$$

Substituting equations (42) and (44) into equation (44), gives $$v_3 = \frac{R_f}{R_1} \cdot \frac{N_{T2}}{N_{T1}} \cdot v_{mn} + \frac{R_f}{R_2} \cdot \frac{M}{R_9 C_6}(1 + pR_{10}C_6)i \quad (46)$$

and, $$v_{Thev} = a_T v_3 = a_T \cdot \frac{R_f}{R_1} \cdot \frac{N_{T2}}{N_{T1}} \cdot v_{mn}$$
$$+ a_T \cdot \frac{R_f}{R_2} \cdot \frac{M}{R_9 C_6}(1 + pR_{10}C_6)i \quad (47)$$

If the relationships $$a_T \cdot \frac{R_f}{R_1} \cdot \frac{N_{T2}}{N_{T1}} = 1 \quad (48)$$

and $$R_{10} \cdot C_6 = \frac{L_{Thev}}{R_{Thev}} \qquad (49)$$

and $$a_T \cdot \frac{R_f}{R_2} \cdot \frac{M}{R_9 C_6} = R_{Thev} \qquad (50)$$

are established, then, $$v_3 = v_{mn} + R_{Thev} \cdot i + L_{Thev} \cdot \frac{di}{dt} = V_{Thev} \qquad (51)$$

Equation (51) expresses the results desired from circuitry shown in FIG. 6, specifically that the output signal of the amplifier 20 (signal $v_3$) is proportional to the Thevenin equivalent voltage. The adjustment of the several resistors may be made in substantially the same manner that has been several times described hereinbefore and once again the most practical method is probably the empirical method of matching an initially recorded wave form at $v_3$ with that when the load is reconnected.

Thus, it is seen that there has been shown and described circuits which employ signals representing the voltage at the terminals at a voltage supply and representative of the rate of change, with respect to time, of the current to accurately simulate or synthesize the Thevenin equivalent voltage of that supply.

While there have been shown and described what are at present considered to be preferred embodiments of the present invention, modifications thereto will readily occur to those skilled in the art. For example, while for the sake of simplicity the system was shown only in the single phase embodiments, it would have at least equal application in multi-phase systems. To employ the present invention in a multi-phase system (e.g., three phase) to obtain the corresponding Thevenin voltage equivalent is believed to be well within the ability of one skilled in the art. For example, a three phase system could employ a three phase transformer for replacement of the transformer T shown in the embodiments illustrated which transformer might have a wye connected primary, a wye connected secondary, and a delta connected tertiary winding to permit the flow of third harmonic current and hold the neutral of the wye connected primary at neutral potential. The respective voltages from the transformer secondaries would be employed along with three separate induction coils, one in each of the three phase lines, and individual circuitry such as was illustrated provided for each phase to provide the three Thevenin equivalent voltages. It is not desired, therefore, that the invention be limited to the specific circuit shown and described and it is intended to cover in the appended claims all such modifications as fall within the true spirit and scope of the invention.

What is claimed is:

1. A circuit for the simulation of a supply voltage which supplies current to a load from a pair of accessible terminals, comprising:
   a. first means to produce a first signal having a value proportional to the voltage at said terminals;
   b. second means to produce a second signal having a value proportional to the rate of change, with respect to time, of the load current;
   c. means to ratio said first and second signals; and,
   d. means to combine the ratioed first and second signals to develop an output signal simulating said supply voltage.

2. The invention in accordance with claim 1 wherein said first and second signals are voltage signals.

3. The invention in accordance with claim 1 wherein said first and second signals are voltage signals proportional, respectively, to the instantaneous values of the voltage at said terminals and the instantaneous rate of change of the load current.

4. The invention in accordance with claim 1 wherein said first means includes a transformer having its primary winding connected across the terminals and said second means includes a coil inductively coupled to a conductor carrying the load current.

5. The invention in accordance with claim 2 wherein:
   a. said first means includes a transformer having its primary winding connected across the terminals to provide as an output from its secondary winding said first signal, said first signal being proportional to the instantaneous voltage across said terminals; and,
   b. said second means includes a coil inductively coupled to a conductor carrying the load current to provide said second signal as a voltage signal proportional to the instantaneous rate of change, with respect to time, of the load current.

6. The invention in accordance with claim 1 wherein said means to combine includes an operational amplifier.

7. A circuit for the synthesization of the Thevenin equivalent voltage of a voltage supply which furnishes current to a load by way of a pair of conductors connected to a pair of supply output terminals, said circuit comprising:
   a. first means to produce a first voltage signal proportional to the voltage across said terminals;
   b. second means to produce a second voltage signal proportional to the rate of change, with respect to time, of the load current;
   c. means to ratio said first and second voltage signals in accordance with the impedance nature of said voltage supply; and,
   d. means to combine the ratioed first and second voltage signals to develop an output signal which synthesizes the Thevenin equivalent voltage of said voltage supply.

8. The invention in accordance with claim 7 wherein said first and second voltage signals have instantaneous values proportional to the instantaneous values, respectively, of the voltage across said terminals and the rate of change of said current.

9. The invention in accordance with claim 7 wherein said first means includes a transformer having its primary winding connected across the terminals and said second means includes a coil inductively coupled to one of the pair of conductors.

10. The invention in accordance with claim 7 wherein said combining means includes an operational amplifier.

11. The invention in accordance with claim 7 wherein said voltage supply has an internal impedance inclusive of a resistive equivalent component and wherein said means to ratio includes means to integrate said second voltage signal.

12. The invention in accordance with claim 7 wherein said voltage supply has an internal impedance inclusive of inductive and resistive equivalent components and wherein said means to ratio includes means to integrate said second voltage signal.

13. A circuit for the synthesization of the Thevenin equivalent voltage of a voltage supply whose internal impedance is primarily inductive in nature and which supplies a current to a load by way of a pair of conductors connected to a pair of voltage supply output terminals, said circuit comprising:
   a. means to supply a first voltage signal proportional to the instantaneous voltage across said output terminals including a transformer having a primary winding and a secondary winding,
      1. said primary winding being connected across said terminals, and
      2. said secondary winding furnishing said first voltage signal;
   b. a coil inductively coupled to a one of said conductors to provide a second voltage signal proportional to the instantaneous rate of change, with respect to time, of the current supplied to the load;
   c. an operational amplifier having first and second variable input resistors and a variable feedback resistor connected between an input and the output thereof; and,
   d. means to furnish said first and second voltage signals to the input of said operational amplifier through, respectively, said first and second variable resistors whereby a signal appearing at the output of said amplifier will be a simulation of the Thevenin equivalent voltage of said voltage supply when said first and second input resistors and said feedback resistors are properly adjusted.

14. The invention in accordance with claim 13 wherein said coil has a nonmagnetic, nonconductive core.

15. A circuit for the synthesization of the Thevenin equivalent voltage of a voltage supply whose internal impedance includes an equivalent resistive component and which supplies current to a load by way of a pair of conductors connected to a pair of voltage supply output terminals, said circuit comprising:
   a. means to supply a first voltage signal proportional to the instantaneous voltage across said output terminals including a transformer having a primary winding and a secondary winding,
      1. said primary winding being connected across said terminals, and
      2. said secondary winding furnishing said first voltage signal;
   b. a coil inductively coupled to a one of said conductors to provide a second voltage signal proportional to the instantaneous rate of change, with respect to time, of the current supplied to the load;
   c. an operational amplifier having first and second variable input resistors and a variable feedback resistor connected between an input and the output thereof;
   d. means to furnish said first voltage signal to the input of said operational amplifier by way of said first variable resistor;
   e. integrating means responsive to said second voltage signal to provide an output signal proportional to the integral of that signal; and
   f. means to supply the integrated output signal to the input of said operational amplifier by way of said second variable resistor whereby a signal appearing at the output of said amplifier will be a simulation of the Thevenin equivalent voltage of said voltage supply when said first and second input resistors and said feedback resistor are properly adjusted.

* * * * *

UNITED STATES PATENT AND TRADEMARK OFFICE
CERTIFICATE OF CORRECTION

PATENT NO. : 3,976,868
DATED      : August 24, 1976
INVENTOR(S) : Lawrence J. Lane It is certified that error appears in the above-identified patent and that said Letters Patent are hereby corrected as shown below:

Column 4, line 31, delete "4" and after "this" insert --theorem--.
Column 7, line 6, cancel "value" and substitute --values--.
Column 10, line 16, cancel "is" (first occurrence) and substitute --in--.
Column 12, line 60, cancel "$\frac{N_{T2}}{\sqrt{N_{T1}^{mn}}}$" and substitute --$\frac{N_{T2}}{N_{T1}} \cdot v_{mn}$--.

Signed and Sealed this

Twenty-fifth Day of April 1978

[SEAL]

Attest:

RUTH C. MASON
Attesting Officer

LUTRELLE F. PARKER
Acting Commissioner of Patents and Trademarks